United States Patent [19]

Honda et al.

[11] Patent Number: 5,264,705
[45] Date of Patent: Nov. 23, 1993

[54] SPECIMEN-DRIVING APPARATUS FOR ELECTRON MICROSCOPE WHICH TILTS AND TRANSLATES WHILE PREVENTING CONTACT DAMAGE

[75] Inventors: Toshikazu Honda; Mikio Naruse; Toshikatsu Kaneyama; Yu Ishibashi, all of Tokyo; Ikuya Nishimura, Hokkaido, all of Japan

[73] Assignee: JEOL Ltd., Tokyo, Japan

[21] Appl. No.: 862,528

[22] Filed: Apr. 2, 1992

[30] Foreign Application Priority Data

Apr. 4, 1991 [JP] Japan .................. 3-99377

[51] Int. Cl.⁵ .......................... H01J 37/20
[52] U.S. Cl. .................. 250/442.11; 250/311
[58] Field of Search ......... 250/442.11, 440.1, 311, 250/310

[56] References Cited

U.S. PATENT DOCUMENTS

| | | | |
|---|---|---|---|
| 4,771,178 | 9/1988 | Egle et al. | 250/442.11 |
| 4,833,330 | 5/1989 | Swann et al. | 250/443.1 |
| 4,950,909 | 8/1990 | Yokoto et al. | 250/442.11 |
| 5,012,092 | 4/1991 | Kobayashi et al. | 250/311 |

FOREIGN PATENT DOCUMENTS 55-028231 2/1980 Japan .
61-220256 9/1986 Japan .

OTHER PUBLICATIONS

Published Japanese Patent Application No. 64-66204.

Primary Examiner—Jack I. Berman
Assistant Examiner—Jim Beyer
Attorney, Agent, or Firm—Webb, Burden, Ziesenheim & Webb

[57] ABSTRACT

A specimen-driving apparatus used with an electron microscope. The apparatus can translate or tilt the specimen holder while preventing it from being damaged if a human operator performs any erroneous operation. The device has X, Y, Z translation directive devices, and a tilt directive device for permitting the operator to enter instructions for translating and tilting the specimen holder. A contact detector senses that the holder is in contact with the upper magnetic pole piece. A tilt condition decision portion determines whether the holder has tilted into the positive or negative domain. A Z domain decision portion determines whether the Z coordinate of the holder lies in the positive or negative domain. When the contact of the holder with the pole piece is detected, reverse movement of the holder along the Z-axis is inhibited. Also, reverse tilting movement of the holder is inhibited. When the holder comes out of contact with the pole piece, these reverse movements are permitted.

3 Claims, 4 Drawing Sheets

SPECIMEN-DRIVING APPARATUS FOR ELECTRON MICROSCOPE WHICH TILTS AND TRANSLATES WHILE PREVENTING CONTACT DAMAGE

FIELD OF THE INVENTION

The present invention relates to a specimen-driving apparatus used in an electron microscope and, more particularly, to a specimen-driving apparatus equipped with mechanisms which prevent the specimen holder from being damaged if any erroneous operation is performed by the operator in translating or tilting the specimen.

BACKGROUND OF THE INVENTION

Figure 5:
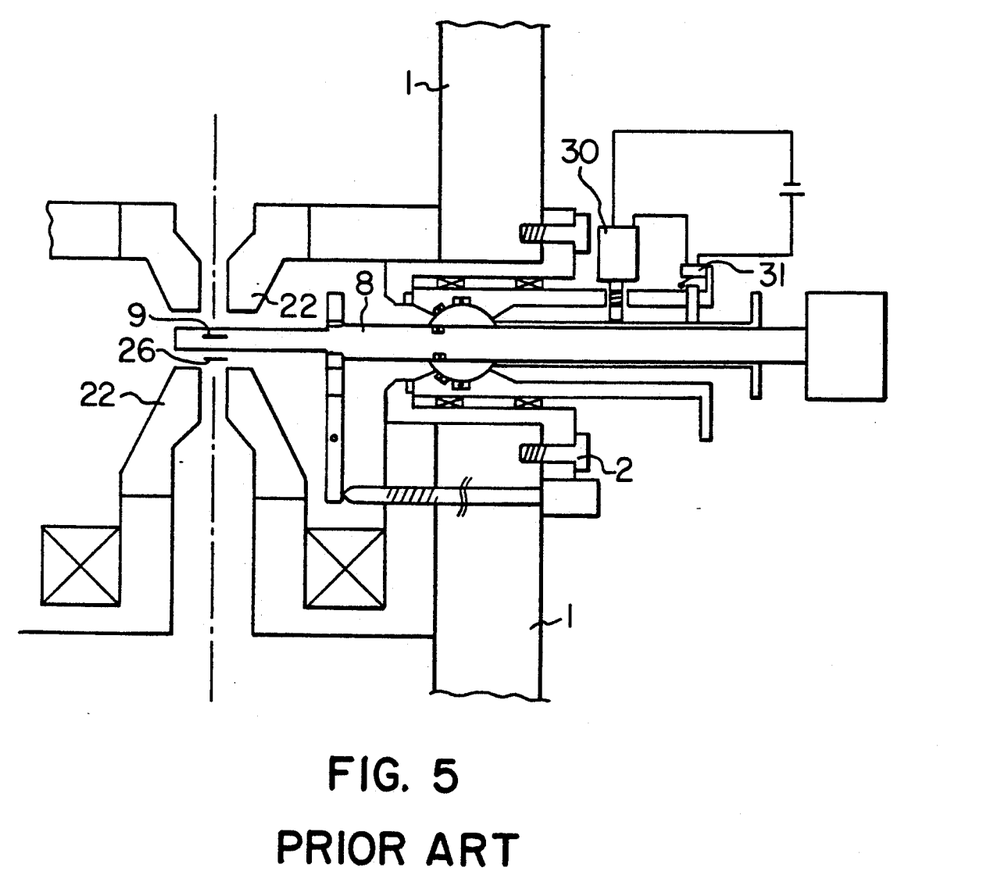
FIG. 5 is a schematic diagram of the prior art specimen-driving apparatus.

A known side-entry goniometer for use with a transmission electron microscope is shown in FIG. 5, where a specimen 9 is attached to the front end of a specimen holder 8. This specimen 9 is inserted between the magnetic pole pieces 22 of the objective lens. This goniometer includes a tilt mechanism for tilting the specimen holder 8 to the optical axis of the electron beam, translation mechanisms for moving the specimen in the X- and Y-directions, respectively, and a Z translation mechanism for moving the specimen substantially along the optical axis. When the specimen holder is tilted or translated by operating the tilt mechanism or some translation mechanisms, there is the possibility that the corresponding motor drives the tilt mechanism or translation mechanisms to thereby damage the specimen holder after the front end of the specimen holder 8 comes into contact with one of the magnetic pole pieces or other member. To prevent this undesirable situation, the conventional specimen-driving apparatus for use with an electron microscope is equipped with the following safety device. As an example, when a motor 30 incorporated in the Z translation mechanism is rotated to translate the specimen holder 8 along the Z-axis and the front end of the holder 8 is about to contact the magnetic pole piece 22 or the objective aperture 26, a microswitch 31 acting as a limiter is depressed to stop the rotation of the motor 30.

In the above-described conventional apparatus, the switch only serves to limit the movements of the translation mechanisms within predetermined ranges. Therefore, if the magnetic pole pieces are replaced with new ones and the gap between the pole pieces is varied, or if the specimen holder is replaced with a new one having a different thickness, then the safety device cannot adequately cope with the situation. Specifically, if the condition varies as described above, the safety device may fail to function satisfactorily. Conversely, the safety device may impede translational or tilting movement even within a region in which such movement is permitted. Hence, satisfactory observations cannot be made.

Accordingly, an apparatus free of these problems has been proposed. In particular, the contact of the specimen holder with the surroundings of the holder such as one of the magnetic pole piece or the aperture is electrically detected. The motor for driving the tilt mechanism is stopped in response to this detection. This proposed apparatus ensures that the specimen holder is brought to a stop at any desired position irrespective of variations in the conditions as described above. However, this apparatus is unable to tilt or translate the specimen into the optimum position while protecting the specimen holder and the aperture after the motor is stopped in response to the detection of the contact.

SUMMARY OF THE INVENTION

It is an object of the present invention to provide a specimen-driving apparatus which is for use with an electron microscope and can bring the specimen into any desired position while preventing the specimen holder from becoming damaged if any erroneous operation is performed.

The above object is achieved by a specimen-driving apparatus for use with an electron microscope, the apparatus comprising: a tilt mechanism for tilting a specimen holder to the optical axis of the electron beam emitted in the electron microscope; a tilt directive means which permits a human operator to give a tilt instruction; a tilt mechanism-driving means for driving the tilt mechanism under the instruction given from the tilt directive means; a Z translation mechanism for translating the specimen holder along the optical axis of the electron beam; a Z translation directive means which permits the operator to give an instruction for translating the specimen holder along the Z-axis; a Z translation mechanism-driving means for driving the Z translation mechanism under the instruction given from the Z translation directive means; a detection means which electrically senses that the front end of the specimen holder is in contact with a surrounding member; a tilt condition decision means which determines whether the specimen holder has tilted into the positive domain or into the negative domain; a tilting movement control means which controls the tilt mechanism-driving means in such a way that when the contact of the front end of the specimen holder is detected, tilt of the specimen holder from the present domain toward the opposite domain is permitted but tilt in the opposite sense is inhibited, and that, when the front end of the holder is detached from the surrounding member, the tilt in the opposite sense is permitted; a Z domain decision means which determines whether the Z coordinate of the specimen holder lies in the positive domain or in the negative domain; and a Z translation control means which controls the Z translation mechanism-driving means in such a way that when the contact of the front end of the specimen holder is detected, translation of the specimen holder form the present domain toward the opposite domain along the Z-axis is permitted but translation in the opposite sense is prevented, and that, when the front end of the holder is detached from the surrounding member, the translation in the opposite sense is permitted.

Other objects and features of the invention will appear in the course of the description thereof which follows.

DETAILED DESCRIPTION OF THE INVENTION

Figure 1:
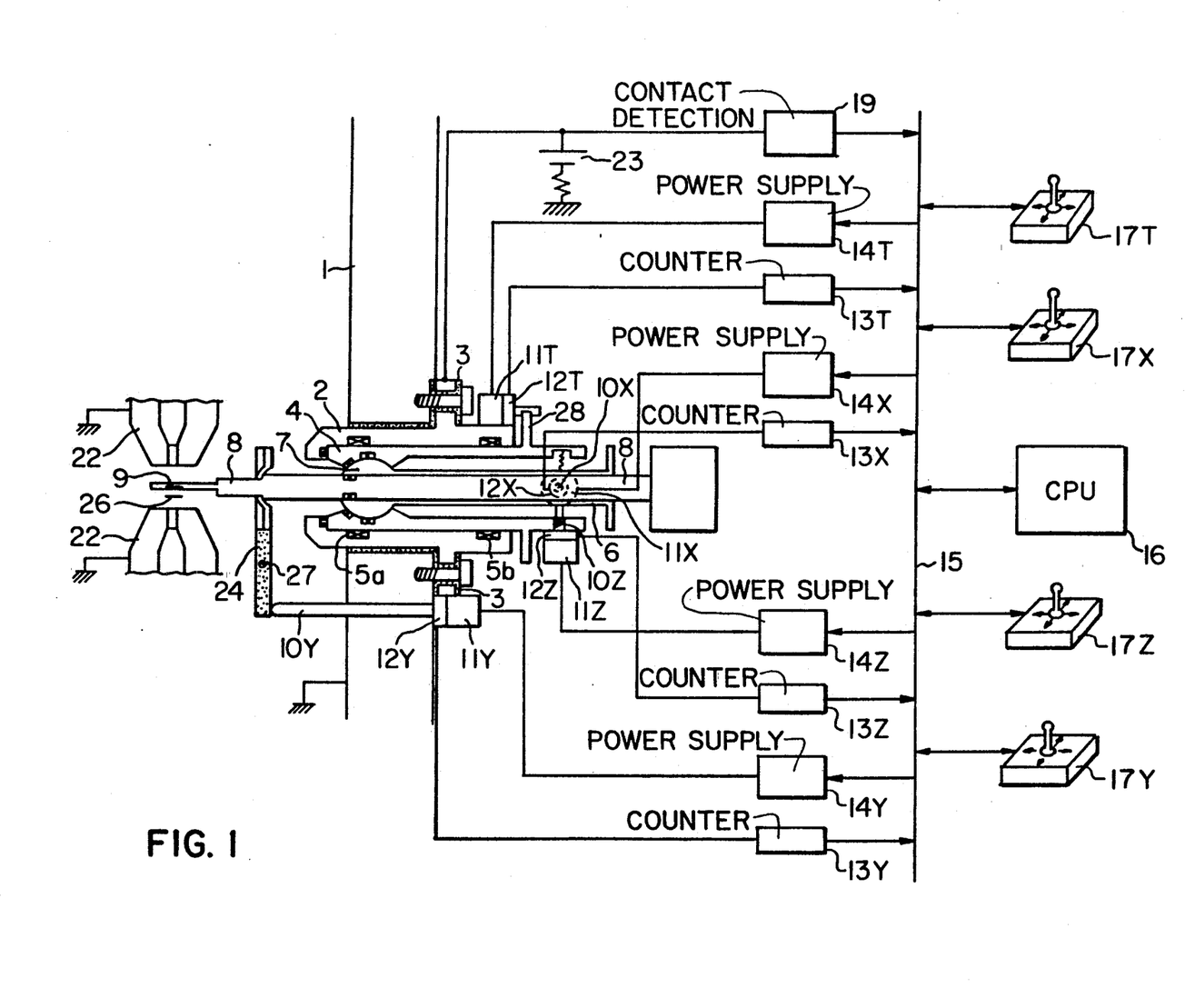
FIG. 1 is a schematic diagram of a specimen-driving apparatus for use with an electron microscope, the apparatus being built in accordance with the present invention.

Referring to FIG. 1, there are shown a specimen-driving apparatus according to the invention and an electron microscope. The microscope has a microscope column 1. The base portion of the goniometer, indicated by 2, is mounted to the microscope column 1 via an insulating member 3 such that the central axis of the base portion is perpendicular to the optical axis of the electron beam. A first holding cylinder 4 is rotatably mounted to the base portion 2 via bearings 5a and 5b. A second holding cylinder 6 is held so as to be tiltable by a spherical bearing 7 mounted inside the first holding cylinder. A specimen holder 8 is fitted in the second holding cylinder 6. A specimen 9 is attached to the front end of the holder 8.

A threaded rod 10Y acts to translate the specimen holder 8 in the Y-direction, or along the axis of the first holding cylinder 4. This rod 10Y is mounted to the microscope column 1 and rotated by a Y translation motor 11Y. When the threaded rod 10Y is rotated, it moves along its axis. This movement is transmitted to the specimen holder 8 via a lever 24 that can rotate about a fulcrum 27. Thus, the holder 8 is translated in the Y-direction. In order to move the holder 8 in the X-direction, i.e., perpendicularly to the plane of the sheet, a setscrew 10X is screwed to the first holding cylinder 4, and is connected to a motor 11X for translation in the X-direction. When the motor 11X is rotated, the setscrew 10X rotates the second holding cylinder 6 about the spherical bearing 7, so that the specimen is translated in the X-direction. In order to translate the specimen 9 in the Z-direction, or substantially along the optical axis, a setscrew 10Z is screwed to the first holding cylinder 4, and is connected to a motor 11Z for translation in the Z-direction. When the motor 11Z is driven, the setscrew 10Z rotates the second holding cylinder 6 about the spherical bearing 7. As a result, the specimen 9 is translated in the Z-direction.

A specimen-tilting motor 11T is mounted to the goniometer base portion 2. When the motor 11T turns, its rotation is transmitted to the first holding cylinder 4 via a toothed wheel 28. The first holding cylinder 4 is rotated while guided by the goniometer base portion 2. The spherical bearing 7, the second holding cylinder 6, and the specimen holder 8 rotate as a unit with the first holding cylinder 4 to tilt the specimen 9 attached to the front end of the holder 8. Rotary encoders 12X, 12Y, 12Z, and 12T are mounted close to the motors 11X, 11Y, 11Z, and 11T, respectively, to detect these rotations. The encoders 12X, 12Y, 12Z, and 12T produce pulse signals to up/down counters 13X, 13Y, 13Z, and 13T, respectively, which count the pulse signals sent from their respective rotary encoders. These counters, values are sent to a CPU 16 via a bus line 15. The motors 11X, 11Y, 11Z, and 11T are rotated by means of driving power supplies 14X, 14Y, 14Z, and 14T, respectively.

An X translation directive device 17X, a Y translation directive device 17Y, a Z translation directive device 17Z, and a tilt directive device 17T are connected to the bus line 15 to order translation in the X-direction, translation in the Y-direction, translation in the Z-direction, and tilt, respectively. The directive device 17X not only permits the operator to indicate the amount of movement but also enables the operator to indicate whether the specimen 9 should be moved in the positive direction or in the negative direction along the X-axis. The other directive devices allow the operator to designate the senses of translational movements and the sense of tilting movement. A DC power supply 23 applies a positive potential to the goniometer base portion 2 that is electrically connected with the front end of the specimen holder 8, to electrically sense that the front end of the holder 8 is in contact with the magnetic pole piece 22 or the aperture 26. The goniometer base portion 2 is held to the microscope column 1 via the insulating member 3. Also, the lever 24 is electrically insulated from the holder 8. In this way, the goniometer base portion 2 is maintained at the positive potential unless the front end of the holder 8 touches the magnetic pole piece 22 or other member. If the holder 8 makes contact with the magnetic pole piece 22 or other member, then the goniometer base portion 2 is placed at ground potential. In order to detect this change in the potential and to transmit the resulting signal to the CPU 16, a contact detection circuit 19 is provided.

Figure 2:
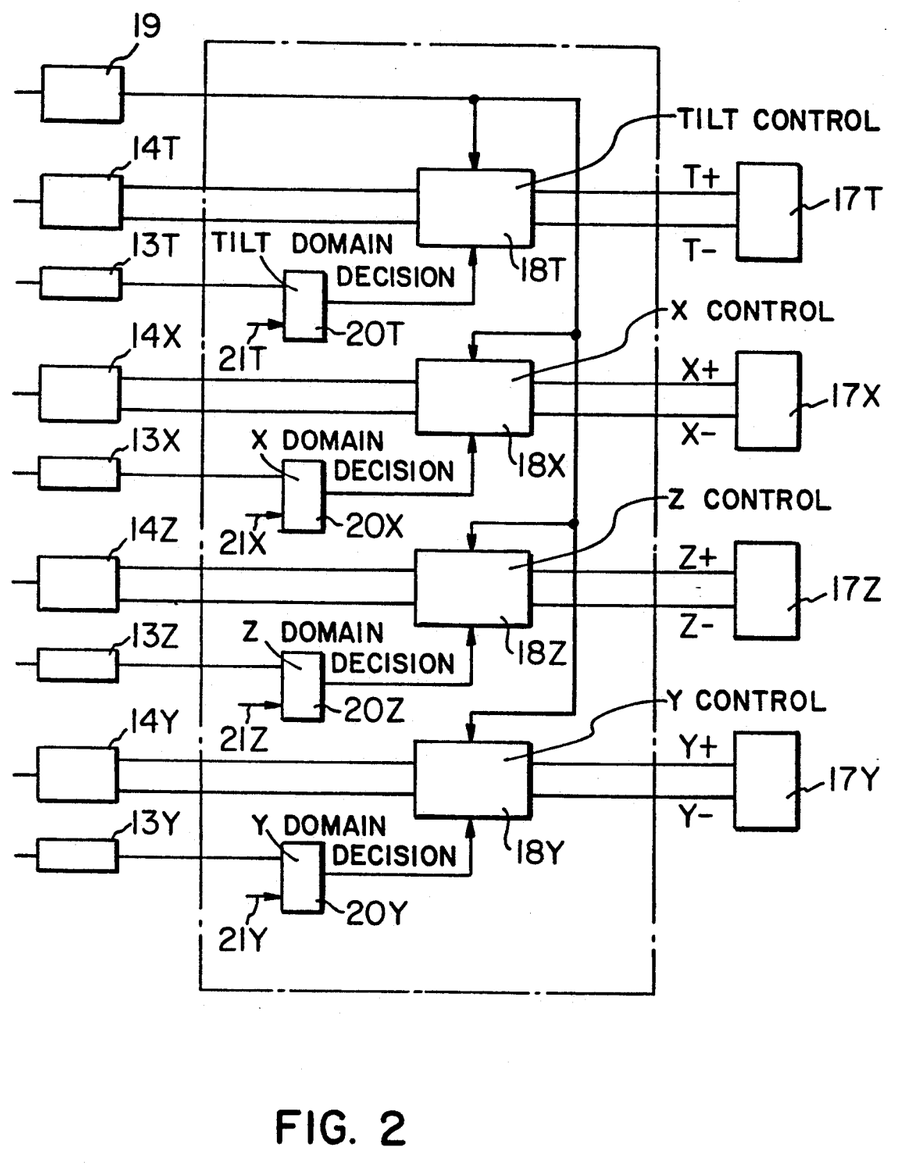
FIG. 2 is a diagram illustrating the functions of the CPU incorporated in the specimen-driving apparatus shown in FIG. 1.

FIG. 2 is a block diagram illustrating the functions of the CPU 16. It is to be noted that like components are indicated by like reference numerals in various figures. An X domain decision portion 20X compares the signal produced from the counter 13X with a reference signal 21X and determines whether the X coordinate of the front end of the specimen holder 8 lies in the positive domain or in the negative domain. One side of the central position 0 of the front end portion of the specimen holder 8 on the X-axis is referred to as the positive domain of X coordinates, while the other side is referred to as the negative domain of X coordinates. The output signal from the X domain decision portion 20X is sent to an X translation control portion 18X. Similarly, signals from the counters 13Y and 13Z are supplied to a Y domain decision portion 20Y and a Z domain decision portion 20Z, respectively. The Y domain decision portion 20Y produces a signal indicating whether the Y coordinate of the front end of the holder 8 is located in the positive or negative domain. Likewise, the Z domain decision portion 20Z delivers a signal indicating whether the Z coordinate of the front end portion lies in the positive or negative domain. The signal from the counter 13T is furnished to a tilt condition decision portion 20T. This decision portion 20T compares the signal from the counter 13T with a reference signal 21T and produces a signal indicating whether the holder 8 has tilted into the positive or negative domain. The signals from the Y domain decision portion 20Y, the Z domain decision portion 20Z, and the tilt condition decision portion 20T are sent to a Y translation control portion 18Y, a Z translation control portion 18Z, and a tilt control portion 18T, respectively. The output signal from a contact detection circuit 19 is fed to the X, Y, Z translation control portions 18X, 18Y, 18Z, respectively, and also to the tilt control portion 18T.

Figure 3A:
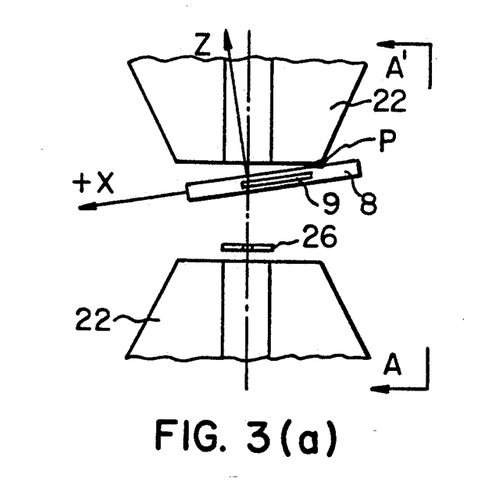
FIG. 3(a) to FIG. 3(c) are schematic views illustrating the operation of the specimen-driving apparatus shown in FIG. 1.
Figure 3B:
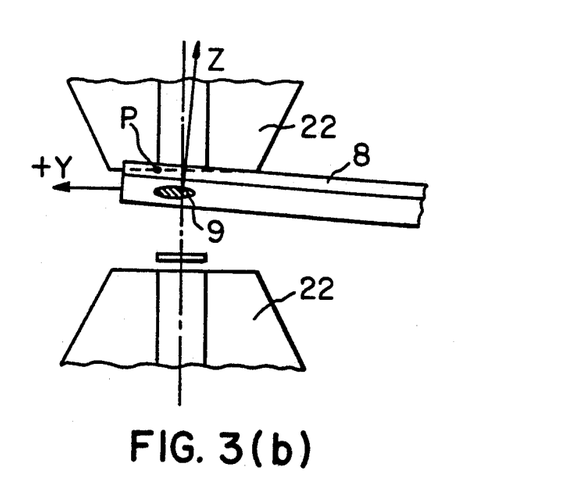
Figure 4A:
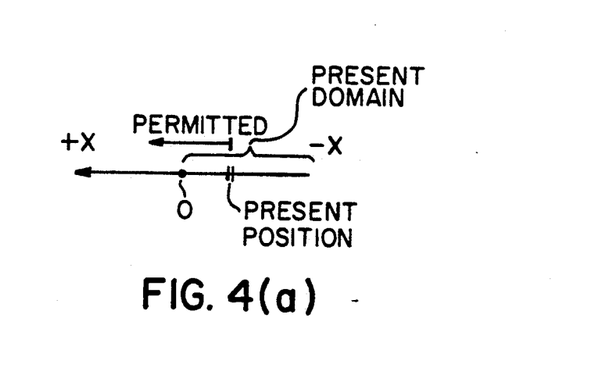
FIG. 4(a) to FIG. 4(d) are diagrams showing the manner in which the domains of the X, Y, Z coordinates and the domains of angular positions are judged.
Figure 4B:
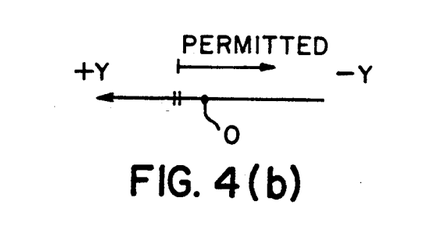
Figure 4C:
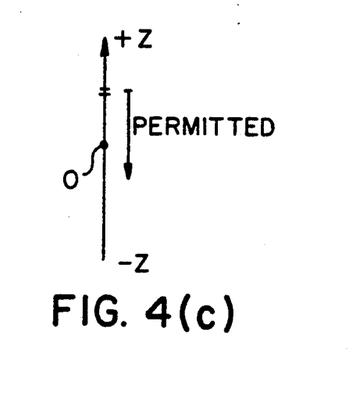
Figure 4D:
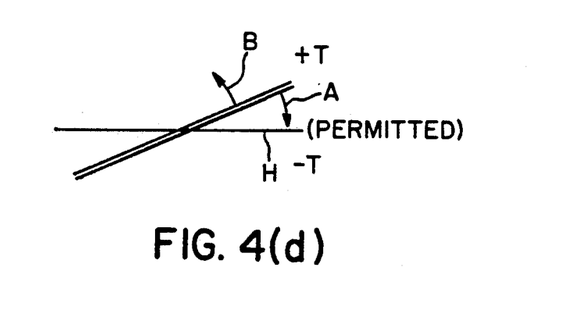

The operation of the instrument constructed as described above is now described. When the field of view is searched for a desired one, the operator operates the X translation directive device 17X, the Y translation directive device 17Y, the Z translation directive device 17Z, and the tilt directive device 17T to order translation or tilt of the specimen. When translational and tilting movements of the specimen are ordered through these directive devices, signals indicative of the movements are fed to the CPU 16. The CPU 16 then supplies control signals to the translation control portions or the tilt control portion corresponding to the instructed movements. As an example, if the tilt directive device 17T is operated to maintain the specimen tilted, then a part P of the specimen holder 8 comes into contact with the upper magnetic pole piece 22, as shown in FIG. 3(a) and FIG. 3(b). FIG. 3(b) is a view taken from the direction indicated by the line A-A' of FIG. 3(a). Since the upper magnetic pole piece 22 is grounded, the goniometer base portion 2 is placed at ground potential. As a result, the contact detection circuit 19 produces a signal indicating the contact to the translation control portions 18X, 18Y, 18Z and to the tilt control portion 18T. The X, Y, Z coordinates of the specimen holder 8 indicated by the signals from the counters 13X, 13Y, 13Z, respectively, i.e., the X, Y, Z coordinates of the specimen 9, are shown in FIG. 4(a), FIG. 4(b), FIG. 4(c), respectively. The angle of tilt or angular position of the specimen holder 8 indicated by the signal from the counter 13T is shown in FIG. 4(d). In FIG. 4(a) to FIG. 4(d), the double lines indicate the specimen holder 8. Consequently, the X domain decision portion 20X, the Y domain decision portion 20Y, and the Z domain decision portion 20Z produce signals indicting that the X, Y, Z coordinates of the specimen holder 8 are located in the positive, negative, and positive domains, respectively, to the X, Y, Z translation control portions 18X, 18Y, 18Z, respectively. Similarly, the tilt condition decision portion 20T sends a signal indicating that the specimen holder 8 has tilted into the positive domain +T to the tilt control portion 18T. This means that one end K of the holder 8 is above a horizontal line H. If the end K is located below the horizontal line H, then it follows that the holder 8 has tilted into the negative domain −T.

Figure 3C:
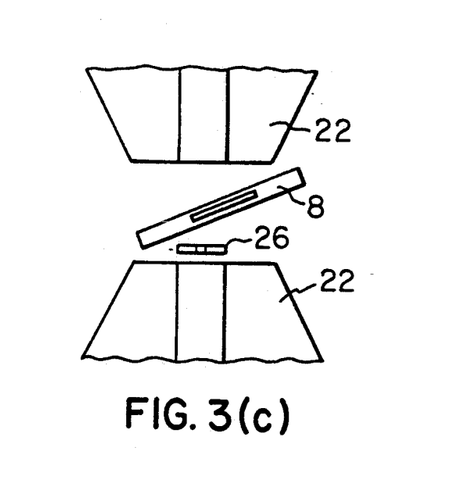

If signals indicating contact are sent to the translation control portions 18X, 18Y, 18Z, and to the tilt control portion 18T, then the tilt control portion 22T permits the holder to tilt from the domain (in this case, the positive domain +T) judged by the tilt decision portion 20T into the opposite domain, or the negative domain −T, in the direction indicated by the arrow A, but the tilt control portion 22T inhibits the holder from tilting in the reverse direction indicated by the arrow B. Therefore, if a tilt in the direction indicated by the arrow B is ordered by the tilt directive device 17T, the supply of electrical current from the tilt driving power supply 14T to the motor 11T is stopped. This brings the tilting movement of the specimen holder 8 to a stop. If the operator desires to make the tilt angle large by adjusting the Z coordinate of the holder 8, then he or she operates the Z translation directive device 17Z. In this case, if the holder 8 is instructed to move forwardly along the Z-axis through the Z translation directive device 17Z, this movement is inhibited, because the present Z coordinate is judged to be located in the positive domain. Accordingly, if the holder is instructed to move rearwardly along the Z-axis via the Z translation directive device 17Z, then the Z translation control portion 18Z permits this movement. Thus, the specimen holder 8 moves the designated distance toward the central postion O shown in FIG. 4(c). If the contact is broken by this movement, the output signal from the contact detection circuit 25 goes back to high level. In consequence, the control portions 18X, 18Y, 18Z, and 18T no longer hinder the movements. Under this condition, if the tilt directive device 17T is operated to rotate the holder 8 in the sense indicated by the arrow B in FIG. 4(d), then the tilt angle of the holder 8 can be increased as shown in FIG. 3(c).

While the described embodiment represents the preferred form of the present invention, it is to be understood that modifications will occur to those skilled in the art without departing from the spirit of the invention. For example, in the above embodiment, an apparatus for driving the side-entry specimen holder used with a transmission electron microscope has been described. The invention can also be applied to other specimen-driving apparatuses which insert specimens between magnetic pole pieces for observations of the specimens. For example, the invention is applicable to cases where the specimen is driven on a top-entry specimen holder used with a transmission electron microscope. Also, the invention can be applied to cases where the specimen holder of a scanning electron microscope is controlled.

In the above-described embodiment, the disengagement of the specimen holder from the upper magnetic pole piece, for example is sensed by the contact detection circuit 19 because the goniometer base portion is no longer at ground potential. The inhibiting operations which permit movements only into the opposite domains immediately cease.

According to another embodiment, the inhibiting operations do not cease simply by disengagement of the specimen holder from the pole piece. Only after the holder has translated (or tilted) in a permitted direction by more than a predetermined amount, as determined by monitoring the counters, do the inhibiting operations cease. For example, after the holder makes contact with the pole piece, the inhibiting operations are started. If the holder is then translated along the Z-axis or tilted by more than a predetermined amount thus bringing the holder out of contact with and away form the pole piece, the inhibiting operations are stopped. The outputs from the counters are monitored to sense that a predetermined amount of tilt or translation in the permitted direction has taken place. The inhibiting operations are thus stopped according to the counters' values.

In addition, in the above embodiment, the specimen holder 8 makes a direct contact with the magnetic pole piece or other member. Alternatively, a resilient board or plate may be interposed between the contacted magnetic pole piece or member and the specimen holder. In particular, this resilient board or plate is attached to the magnetic pole piece with a slight gap between them. The contact of the front end of the specimen holder 8 with the board is electrically detected. Also, the contact (strictly, indirect contact) of the holder 8 with the magnetic pole piece may be detected by electrically sensing that the board against which the front end of the holder 8 pushes makes contact with the magnetic pole piece.

Preferably, a display is provided on a CRT or the like only during the period of the contact of the holder to help the operator recognize the condition. Also, the X, Y, Z coordinates and the angle of tilt of the specimen holder may be roughly displayed on the CRT.

Further, in the above embodiment, various operations are carried out under the control of the CPU. This CPU may be replaced by various combinations of analog or digital control circuits.

As can be understood from the description made thus far, the present invention offers a specimen-driving apparatus which is used with an electron microscope and which, after the contact is detected and the motors are stopped, translates or tilts the specimen while preventing the holder from getting damaged if any erroneous operation is effected. In this way, the holder can be placed into any desired position easily.

Having thus described our invention with the detail and particularity required by the Patent Laws, what is claimed to be protected by Letters Patent is set forth in the following claims.

What is claimed is:

1. A specimen-driving apparatus for positioning a specimen holder used with an electron microscope, said specimen holder having a front end upon which a specimen can be mounted and thereby positioned along an electron optical axis of the electron microscope, comprising:

a tilt mechanisms for tilting a specimen holder to the optical axis of the electron beam emitted in the electron microscope;

a tilt directive means which permits a human operator to give a tilt instruction;

a tilt mechanism-driving means for driving the tilt mechanism under the instruction given from the tilt directive means;

a Z translation mechanism for translating the specimen holder along the optical axis of the electron beam;

a Z translation directive means which permits the operator to give an instruction for translating the specimen holder along the Z-axis;

a Z translation mechanism-driving means for driving the Z translation mechanism under the instruction given form the Z translation directive means;

a detection means which electrically senses that the front end of the specimen holder is in contact with a surrounding member and provides a contact signal indicative of whether contact has been established or contact has been broken;

a tilt condition decision means which determines whether the specimen holder has tilted into a positive tilt domain or into a negative tilt domain;

a tilting movement control means which controls the tilt mechanism-driving means in such a way that when the contact of the front end of the specimen holder is detected, tilt of the specimen holder from a present tilt domain toward an opposite tilt domain is permitted but tilt in an opposite sense is inhibited, and that when the front end of the holder is detached form the surrounding member, the tilt in the opposite sense is permitted;

a Z domain decision means which determines whether the Z coordinate of the specimen holder lies in a positive Z domain or in a negative Z domain; and a Z translation control means which controls the Z translation mechanism-driving means in such a way that when the contact of the front end of the specimen holder is detected, translation of the specimen holder for ma present Z domain toward an opposite Z domain along the Z-axis is permitted but translation in an opposite sense is inhibited, ad that when the front end of the holder is detached from the surrounding member, the translation in the opposite sense is permitted.

2. A specimen-driving apparatus for use with an electron microscope as set forth in claim 1, wherein after contact of the specimen holder with surrounding member the tilt in the opposite sense and the translation in the opposite sense are again permitted when the contact signal indicates that the contact is broken.

3. A specimen-driving apparatus for use with an electron microscope as set forth in the claim 1, wherein encoders associated with each translation and tilt produce pulse signals which are applied to up/down counters, and wherein after contact of the specimen holder with a surrounding member the tilt in the opposite sense and translation in the opposite sense are again permitted after means monitoring the up/down counters sense that the specimen holder tilts int eh permitted direction by more than a predetermined angle or the specimen holder is translated along the Z-axis in the permitted direction by more than a predetermined distance.

* * * * *

UNITED STATES PATENT AND TRADEMARK OFFICE
CERTIFICATE OF CORRECTION

PATENT NO. : 5,264,705

DATED : November 23, 1993

INVENTOR(S) : Toshikazu Honda, Mikio Naruse, Toshikatsu Kaneyama, Yu Ishibashi and Ikuya Nishimura It is certified that error appears in the above-indentified patent and that said Letters Patent is hereby corrected as shown below:

Column 3 Line 60 "counters," should read --counters'--.

Column 5 Line 27 "indicting" should read --indicating--.

Column 5 Line 65 "postion" should read --position--.

Column 6 Line 38 "form" should read --from--.

Claim 1 Line 17 Column 7 "mechanisms" should read --mechanism--.

Claim 1 Line 34 Column 7 "form" should read --from--.

Claim 1 Line 8 Column 8 "form" should read --from--.

Claim 1 Line 18 Column 8 "for ma" should read --from a--.

UNITED STATES PATENT AND TRADEMARK OFFICE
CERTIFICATE OF CORRECTION

PATENT NO. : 5,264,705

DATED : November 23, 1993

INVENTOR(S) : Toshikazu Honda, Mikio Naruse, Toshikatsu Kaneyama, Yu Ishibashi and Ikuya Nishimura It is certified that error appears in the above-indentified patent and that said Letters Patent is hereby corrected as shown below:

Claim 1 Line 20 Column 8 "ad" should read --and--.

Claim 2 Line 26 Column 8 before "surrounding" insert --a--.

Claim 3 Line 38 Column 8 "int eh" should read --in the--.

Signed and Sealed this

Twenty-fourth Day of May, 1994

Attest:

BRUCE LEHMAN

Attesting Officer    Commissioner of Patents and Trademarks